(12) United States Patent
Rudolph

(10) Patent No.: US 9,684,020 B2
(45) Date of Patent: Jun. 20, 2017

(54) MERGING UNIT AND METHOD OF OPERATING A MERGING UNIT

(75) Inventor: Thomas Rudolph, Rosbach v.d.H. (DE)

(73) Assignees: Schneider Electric GmbH, Ratingen (DE); ALSTOM Technology Ltd, Baden (CH)

( * ) Notice: Subject to any disclaimer, the term of this patent is extended or adjusted under 35 U.S.C. 154(b) by 905 days.

(21) Appl. No.: 14/007,125

(22) PCT Filed: Mar. 26, 2012

(86) PCT No.: PCT/EP2012/055316
§ 371 (c)(1),
(2), (4) Date: Nov. 19, 2013

(87) PCT Pub. No.: WO2012/127058
PCT Pub. Date: Sep. 27, 2012

(65) Prior Publication Data
US 2014/0074415 A1  Mar. 13, 2014

(30) Foreign Application Priority Data

Mar. 24, 2011 (EP) .................................. 11159552
Mar. 24, 2011 (EP) .................................. 11159554

(51) Int. Cl.
*G01R 21/133* (2006.01)
*H04J 3/06* (2006.01)

(52) U.S. Cl.
CPC .......... *G01R 21/133* (2013.01); *H04J 3/0644* (2013.01)

(58) Field of Classification Search
CPC ................................................... G01R 21/133
(Continued)

(56) References Cited

U.S. PATENT DOCUMENTS 5,807,245 A * 9/1998 Aldestam ............... A61B 5/085
                                              600/300
6,954,704 B2 * 10/2005 Minami ............... H02H 1/0061
                                              700/292
(Continued)

FOREIGN PATENT DOCUMENTS

CN          1761124 A     4/2006
CN        101026633 A     8/2007
(Continued)

OTHER PUBLICATIONS

International Search Report issued Jun. 25, 2012 in PCT/EP2012/055316.

(Continued)

*Primary Examiner* — Ricky Ngon
(74) *Attorney, Agent, or Firm* — Oblon, McClelland, Maier & Neustadt, L.L.P.

(57) ABSTRACT

A merging unit for substation automation includes at least one input interface for receiving input data characterizing at least one voltage and/or current related to a component of a power system, and a timing synchronization mechanism which includes an interface to an external synchronization network operating according to one of Inter Range Instrumentation Group, IRIG, -B standard, the 1PPS standard and the Institute of Electrical and the Electronics Engineers, IEEE, 1588 standard. The merging unit is configured to implement logical nodes according to the International Electrotechnical Commission, IEC, 61850-7 standard. The merging unit is configured to map information to and/or from at least one of the logical nodes; to the IEC 61850-9-2 sampled measured values, SMV, communication protocol.

11 Claims, 5 Drawing Sheets

(58) Field of Classification Search
USPC .......................................................... 702/60
See application file for complete search history.

(56) References Cited

U.S. PATENT DOCUMENTS

| | | | |
|---|---|---|---|
| 8,934,471 B2 | 1/2015 | Yang et al. | |
| 2004/0059469 A1 | 3/2004 | Hart | |
| 2007/0114987 A1 | 5/2007 | Kagan | |
| 2008/0065270 A1 | 3/2008 | Kasztenny et al. | |
| 2009/0113049 A1 | 4/2009 | Nasle et al. | |
| 2009/0265124 A1 | 10/2009 | Kagan | |
| 2009/0327787 A1 | 12/2009 | Yu et al. | |
| 2010/0153036 A1 | 6/2010 | Elwarry et al. | |
| 2011/0112699 A1 | 5/2011 | Tournier et al. | |
| 2012/0014315 A1 | 1/2012 | Yang et al. | |

FOREIGN PATENT DOCUMENTS

| | | |
|---|---|---|
| CN | 101431230 A | 5/2009 |
| CN | 101498757 A | 8/2009 |
| CN | 201 569 691 U | 9/2010 |
| CN | 101841399 A | 9/2010 |
| EP | 1 134 867 A1 | 9/2001 |
| EP | 1 830 450 A1 | 9/2007 |
| EP | 1898509 A1 | 3/2008 |
| EP | 2159893 A1 | 3/2010 |
| KR | 10-2008-0094489 A | 10/2008 |
| RU | 88157 U1 | 10/2009 |
| WO | 2009136975 A2 | 11/2009 |

OTHER PUBLICATIONS

Extended European Search Report issued Nov. 15, 2011 in Patent Application No. 11159554.2.
Klaus-Peter Brand, "The Standard IEC 61850 as Prerequisite for Intelligent Applications in Substations" IEEE, Power Engineering Society General Meeting, XP010756486, Jun. 6, 2004, pp. 714-718.
Kenneth E. Martin, "Synchrophasor Standards Development—IEEE C37.118 & IEC 61850" System Sciences (HICSS), XP031981200, Jan. 4, 2011, pp. 1-8.
A. Apostolov, et al., "IEC 61850 Process Bus—Principles, Applications and Benefits" IEEE Protective Relay Engineers, XP031679128, Mar. 29, 2010, pp. 1-6.
Yonghui Yi, et al., "An IEC 61850 Universal Gateway Based on Metadata Modeling" Power Engineering Society General Meeting, IEEE, XP031118555, Jun. 1, 2007, pp. 1-5.
Russian Office Action issued Oct. 8, 2015 in Patent Application No. 2013147200/07(073341).

* cited by examiner

MERGING UNIT AND METHOD OF OPERATING A MERGING UNIT

FIELD OF THE INVENTION

The present invention relates to a merging unit, particularly for substation automation.

The present invention further relates to a method of operating a merging unit.

BACKGROUND

Merging units are e.g. used in substation automation systems for collecting and forwarding sensor data to further devices such as intelligent electronic devices (IEDs) provided for protection and/or control purposes on a higher level of said substation automation system.

It is an object of the present invention to provide an improved merging unit and an improved method of operating a merging unit that provide an increased operational flexibility and enable a reduced complexity for higher level architectures of a substation automation system and provides a basis for a better power quality monitoring of an electrical distribution grid, for electrical grid stability and for wide area monitoring, protection and control schemes (WAMPAC).

SUMMARY

Regarding the abovementioned merging unit, this object is achieved by said merging unit comprising at least one input interface for receiving input data characterizing voltage and/or current measurements related to a component of a power system, wherein said merging unit further comprises a control unit that is configured to determine power quality information and/or phasor measurement information depending on said input data.

The determination of power quality information and/or of phasor measurement information within the inventive merging unit advantageously enables to provide a simplified substation automation system architecture and provides the information required for enhanced electrical grid stability related to functions implemented on substation and/or network control center level.

According to a preferred embodiment, said merging unit is configured to transform said received input data into a predetermined output format, whereby transformed input data is obtained, and to output said transformed input data to a further device. Thus, input data collected by the merging unit can locally be processed within the merging unit and can be forwarded to external devices such as IEDs of the substation automation system in the desired data format. Alternatively or additionally, the power quality information and/or the phasor measurement information, which is determined by the control unit of the merging unit according to the embodiments, can also be transformed to a predetermined data format which e.g. facilitates evaluation of said power quality information and/or of said phasor measurement information by other devices.

According to a further preferred embodiment, said merging unit is configured to output said power quality information and/or said phasor measurement information to a further device.

According to a further preferred embodiment, said merging unit is configured to assign timestamp information to said power quality information and/or to said phasor measurement information and/or said input data and/or said transformed input data, which enables a particularly precise assessment of the data collected by the merging unit. Especially, further devices which are supplied with the respective data by the merging unit according to the embodiments, such as e.g. protection and/or control IEDs, can process the respective data with a correct time reference, which is particularly advantageous if said data is delivered to the protection and/or control IEDs by various merging units that are geographically distributed.

According to a further preferred embodiment, said merging unit is configured to implement at least one logical node according to the International Electrotechnical Commission, IEC, 61850-7 standard, wherein said logical node preferably comprises at least one of: QFVR, QITR, QIUB, QVTR, QVUB, TCTR, TVTR, MMXU, MMXU including PMU (phasor measurement) data, GGIO. Thus, the merging unit according to the embodiments can advantageously make use of underlying data model as specified by the IEC 61850 standard.

According to a further preferred embodiment, said merging unit is configured to map information to and/or from said at least one logical node to at least one of the following communication protocols: IEC 61850-8-1 (Mapping to MMS), IEC 61850-8-1 Generic Object Oriented Substation Event (GOOSE), IEC 61850-9-2 Sampled Measured values (SMV), IEC 61850-90-5 (Synchrophasor), whereby a particularly efficient communications process between the logical node(s) as implemented in the merging unit according to the embodiments and external devices such as e.g. protection and/or control IEDs is attained.

According to a further preferred embodiment, said merging unit is configured to map communications according to IEC 61850-8-1 to a, preferably dedicated, first physical communications port, and to map communications according to IEC 61850-9-2 to a, preferably dedicated, second physical communications port. Alternatively, the first physical communications port, which is proposed to support IEC 61850-8-1 communications, may also be employed for IEC 61850-9-2 communications. Further alternatively or additionally, communications according to the IEC 61850-90-5 or IEEE C37.118 standards may also be mapped to either one of said physical communications ports or further ports provided for communications.

A further solution to the object of the present invention is given by a method of operating a merging unit according to claim 8. Further advantageous embodiments are subject of the dependent claims.

BRIEF DESCRIPTION OF THE FIGURES

Further aspects, features and embodiments of the present invention are given in the following detailed description with reference to the drawings, in which.

DETAILED DESCRIPTION

Figure 1:
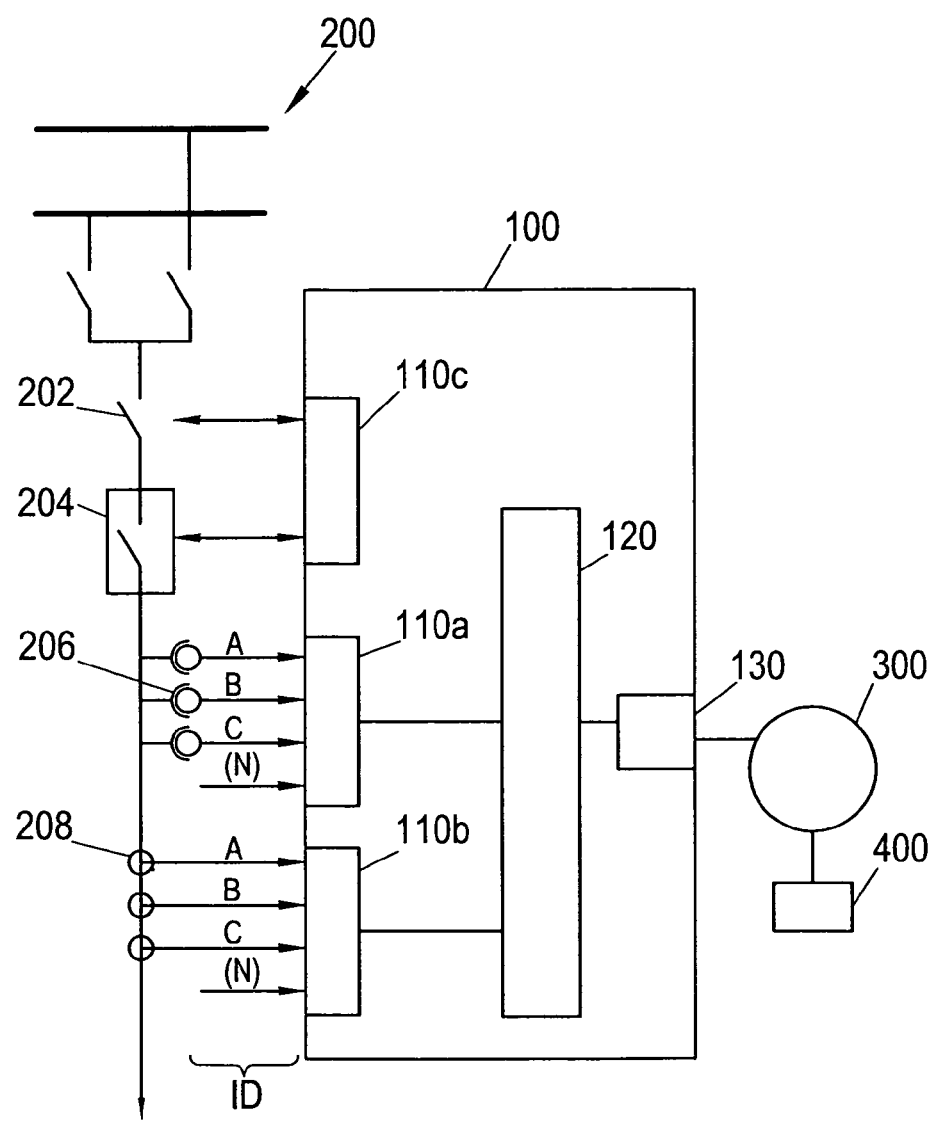
FIG. 1 depicts a schematic block diagram of an embodiment of the inventive merging unit.

FIG. 1 depicts a schematic block diagram of a first embodiment of an inventive merging unit 100, which is assigned to a power system 200 for processing input data ID, such as sensor data, characterizing voltage and/or current measurements related to components of said power system 200.

Said power system 200 exemplarily comprises switchgear like disconnectors 202 and circuit breakers 204. Further, the power system 200 comprises one or more voltage transformers 206 and one or more current transformers 208 for transforming the voltages and/or currents of the power system 200 in a per se known manner, i.e. to reduced value ranges, to facilitate measurement and analysis of these parameters.

For example, the voltage transformers 206 may comprise conventional voltage transformers and/or non-conventional voltage transformers. Likewise, the current transformers 208 may comprise conventional current transformers and/or non-conventional current transformers such as e.g. non-contact current transformers (NCCT) of the Rogowski coil or fibre-optic type.

For receiving output signals of the voltage transformers 206 and the current transformers 208, which are further referred to as "input data" ID to the merging unit 100, the merging unit 100 comprises respective input interfaces.

According to the present embodiment, the merging unit 100 comprises a first input interface 110$a$, which is configured to receive the output signals of the voltage transformers 206 as input data ID. The merging unit 100 also comprises a second input interface 110$b$, which is configured to receive the output signals of the current transformers 208 as input data ID.

Depending on the specific configuration of the voltage transformers 206 and the current transformers 208, the first input interfaces 110$a$, 110$b$ comprise respectively configured input ports. For example, if the voltage transformers 206 are of the conventional type delivering an output voltage within e.g. a 0 V to 100 V range depending on a primary voltage of a component 204 of the power system 200 to which the voltage transformers 206 are connected, the first input interface 110$a$ is capable of processing said respective input data within the specified voltage range. The same applies to the specific configuration of the second input interface 110$b$ which is connected to the current transformers. I.e., for operating conventional current transformers, the second input interface 110$b$ may e.g. be configured to receive a current signal within the 0 A to 5 A range.

Optionally, the merging unit 100 may also comprise at least one further input interface 110$c$, which is configured to receive input data in binary form such as e.g. from position indicators or other components of the power system 200 providing binary output data.

For processing the received input data ID, the merging unit 100 comprises a control unit 120, which may e.g. comprise a microprocessor and/or a digital signal processor (DSP) or any other type of calculating means that are capable of performing the required steps of processing.

After processing the input data ID, the merging unit 100 may forward processed input data to an external device. According to the embodiment of FIG. 1, the merging unit 100 comprises a data interface 130 which e.g. serves to establish a data connection with a network 300 and/or further devices 400, e.g. via said network 300.

For instance, the data interface 130 could comprise an Ethernet-type interface, which may provide data connections between the merging unit 100 and other Ethernet based devices as protection relays, bay computers, substation level devices like Gateways, substation computer or Human-Machine Interfaces (HMI) identified as substation Automation System (SAS), which may e.g. use IEC 61850-9-2 and IEC 61850-8-1 protocol as a option.

Generally, according to a preferred embodiment, the merging unit 100 is configured to perform measurements, preferably real-time measurements, of the input data ID as provided by the instrument transformers 206, 208, and to forward said measurements to further external components 400. As will be explained in detail below, the measurements related to the input data ID may inter alia comprise a transformation of those portions of input data received in the analog domain to the digital domain.

Presently, substation automation systems, which are used to control power systems 200 as exemplarily depicted by FIG. 1, are based on a functional distribution which is mainly structured into 3 levels: process Level, bay level and substation level. In this context, the merging unit 100 may typically represent a device of the process level or of the substation level, and the device 400 may represent an intelligent electronic device (IED) in the sense of the IEC 61850 standard which is provided at the bay level, e.g. a protection or control IED.

According to the present invention, apart from performing said measurements, preferably real-time measurements, of the input data ID as provided by the instrument transformers 206, 208, and to forward said measurements to further external components such as bay level IEDs 400, the merging unit 100, or its control unit 120, respectively, is further configured to determine power quality information and/or phasor measurement information depending on said input data ID or the associated measurements obtained via the input interfaces 110$a$, 110$b$. According to an embodiment, said phasor measurement information may e.g. be transmitted via the data interface 130 to further components, e.g. by employing communications according to the IEC 61850-90-5 (Synchrophasor) or IEEE C37.118 standards. Such further components may e.g. represent phasor data concentrators (PDCs).

Thus, in addition to forwarding voltage and/or current measurements to external devices 400, the inventive merging unit 100 advantageously enables to locally determine a power quality and/or phasor measurements associated with the input data ID that reflects voltages and/or currents of the power system 200 the merging unit 100 is associated with. The power quality information and/or the phasor measurement information so obtained may also be forwarded to further devices 400. According to a preferred embodiment, the phasor measurements comprise a vectorial three-phase representation of voltages and currents at a fundamental network frequency of the power system 200 associated to the inventive merging unit 100.

By integrating the above explained functionality directed to determining power quality and/or phasor measurements, substation automation systems may be provided which comprise less IEDs, particularly on the bay level. Apart from saving costs by reducing the number of elements of the substation automation systems, higher accuracy regarding the power quality information and/or the phasor measurement information may also be attained since the power quality information and/or the phasor measurement information is determined at the same stage, i.e. the merging unit 100, where the basic input data ID for deriving said power quality information and/or said phasor measurement information is obtained.

Moreover, less documentation is required for substation automation systems that are equipped with the inventive merging units 100 since a higher degree of functional integration is provided.

Still further, the forwarding of power quality information and/or of phasor measurement information obtained according to the present invention may seamlessly be integrated with existing data exchange techniques such as e.g. according to the IEC 61850 standard, in particular according to at least one of the IEC 61850-90-5 or IEEE C37.118 standards.

Figure 2:
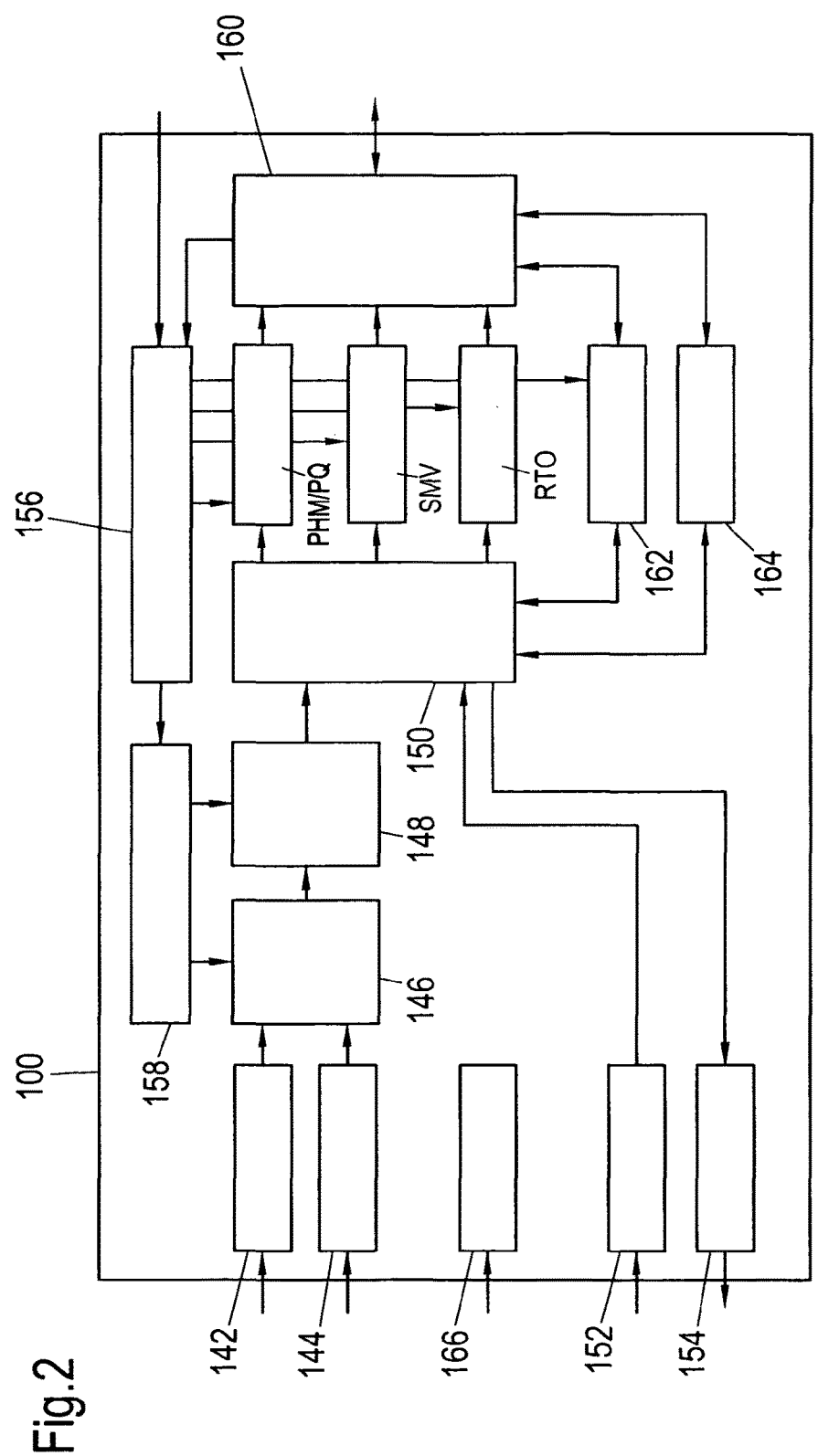
FIG. 2 depicts a detailed functional block diagram of an embodiment of the inventive merging unit.

FIG. 2 depicts a detailed functional block diagram of an embodiment of the inventive merging unit 100.

As depicted by FIG. 2, the merging unit 100 comprises input conditioning means 142 for conditioning the output signals of the voltage transformers 206 (FIG. 1) as received at the first input interface 110a of the merging unit 100. Likewise, the merging unit 100 comprises input conditioning means 144 for conditioning the output signals of the current transformers 206 (FIG. 1) as received at the second input interface 110b of the merging unit 100.

Depending on a specific measurement scheme employed by the merging unit 100, the input conditioning means 142, 144 may be configured to provide standardized analog signals to a subsequent signal processing stage 146 that is configured to apply steps of filtering and sample and hold to the supplied signals. Optionally, internal signal paths or components of the processing stage 146 may be multiplexed in a per se known manner.

The processing stage 146 forwards respective output data to the analog to digital (A/D) converter means 148 which transform the analog output signals provided by the processing stage 146 to the digital domain. Thus, digital data representing the input data ID (FIG. 1), which relates to voltage and/or current values associated with the power system 200 may be forwarded to the digital signal processing means 150.

The merging unit 100 also comprises input conditioning means 152 for binary input data ID, such as received via the further input interface 110c (FIG. 1), which are configured to forward respectively conditioned binary input data to the digital signal processing means 150.

Optionally, output relay interface means 154 may also be provided at the merging unit 100 in order to enable external devices to be controlled like auxiliary relays, circuit breakers, disconnectors or any other equipment.

In order to enable time synchronization of the input data ID or the respective measurement values (e.g., digital samples as obtained by the ADC 148), time synchronization means 156 are provided. Said time synchronization means 156 may provide an integrated clock and/or corresponding counter modules (not shown). Moreover, the time synchronization means 156 advantageously comprise an interface to an external synchronisation network, which may e.g. operate according to the Inter Range Instrumentation Group, IRIG, -B and/or the 1PPS standards, and/or to Institute of Electrical and Electronics Engineers, IEEE, 1588.

A sample and conversion control 158 is supplied with respective timing information from the time synchronization means 156, whereby the steps of filtering, multiplexing, sample and hold and ADC within the components 146, 148 may performed with a precise time reference.

According to the present invention, the digital signal processing means 150 are configured to determine power quality information PQ and/or to determine phasor measurement information PHM depending on said input data ID (FIG. 1) obtained from the respective input interfaces 110a, 110b. The power quality information PQ and/or the phasor measurement information PHM, too, may advantageously be associated with timing information supplied by the time synchronization means 156. Thus, precise time stamps can be assigned to the power quality information PQ and/or to the phasor measurement information PHM to facilitate a precise subsequent processing thereof in the context of the power system 200.

Additionally, the digital signal processing means 150 are configured to determine sample measured values SMV depending on said input data ID (FIG. 1) obtained from the respective input interfaces 110a, 110b. The sample measured values SMV may advantageously also be associated with timing information supplied by the time synchronization means 156.

Optionally, the digital signal processing means 150 may also be configured to determine further real-time operating measurements RTO, preferably also at least partially depending on said input data ID (FIG. 1) obtained from the respective input interfaces 110a, 110b. The further real-time operating measurements RTO may advantageously also be associated with timing information supplied by the time synchronization means 156.

As already mentioned before, the sampling of input data ID (FIG. 1) is controlled by the sample and conversion control 158 which is controlling as well the A/D converter 148. Since the sampled measured values SMV—as well as power quality information PQ and/or phasor measurement information PHM—requires a precise time synchronisation, the time synchronisation means 156 provide respective synch signals for the sample and conversion control 158 as well as for the time stamps of PQ, PHM, SMV, RTO, and optionally also for real-time digital information 162.

The digital signal processing means 150 preferably convert all signals into the related format and manage the binary I/O of the merging unit 100, cf. the blocks 152, 154 as well.

For exchange with further devices 400 (FIG. 1), all data to be exchanged are mapped by communications mapping means 160 to a predetermined related communication protocol, a variant of which will be explained below with reference to FIG. 3.

Furthermore, a configuration, setting and test block 164 may be provided which is using well-known protocols such as e.g. FTP (file transfer protocol) and HTTP (hyper text transfer protocol) for remote and local access to the merging unit 100. The implementation of the power supply 166 is depending on the application.

According to a preferred embodiment, one or more of the functional blocks of the merging unit 100 explained above with reference to FIG. 2 may advantageously be integrated to the control unit 120 (FIG. 1).

Figure 3:
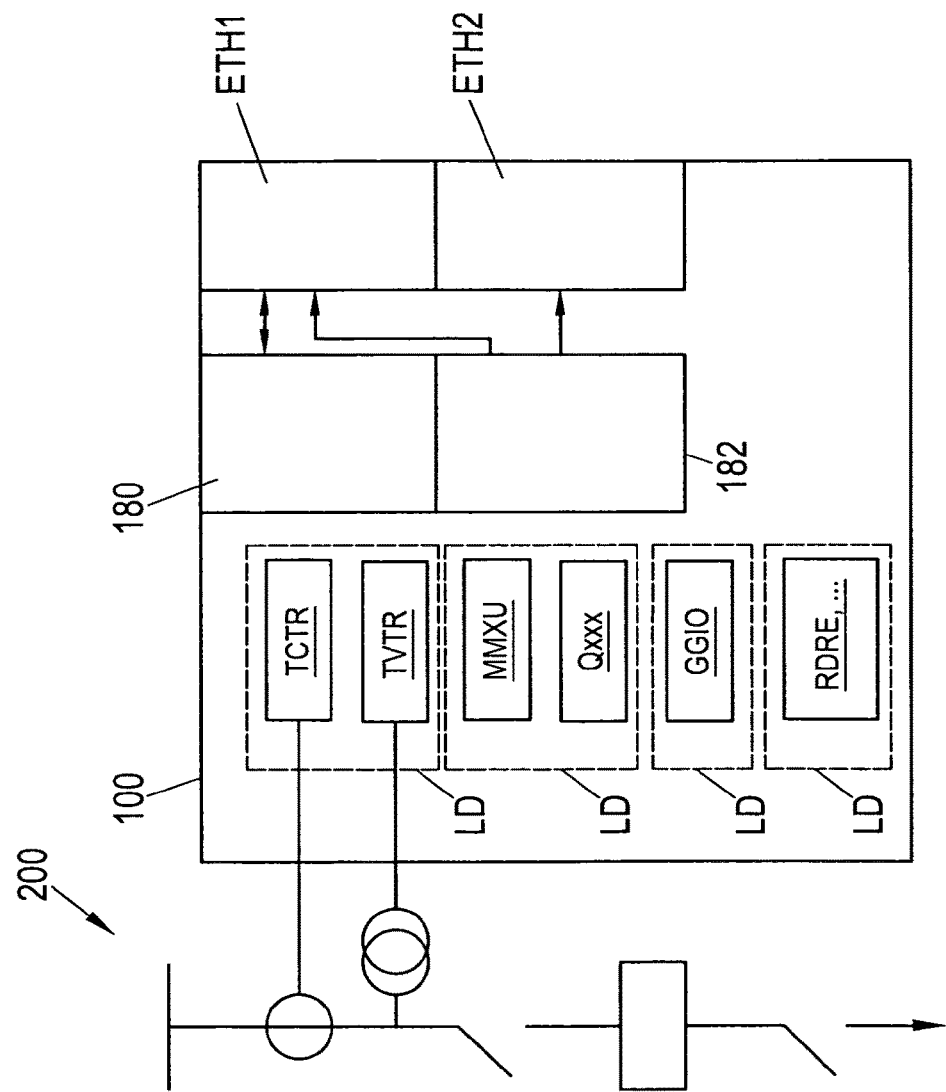
FIG. 3 depicts a schematic block diagram of a third embodiment of the inventive merging unit.

FIG. 3 depicts an internal structure of an inventive merging unit 100 according to an embodiment from the communication point of view based on IEC 61850. Following the IEC 61850 hierarchical concept of communication modeling, the physical device (PD) in the context of IEC 61850 is equivalent to the merging unit 100. The PD 100 contains one or more logical devices LD, cf. the dashed rectangles, which are used to group Logical Nodes LN (e.g. TCTR, TVTR, . . . ) which belong together like LNs TCTR, TVTR for transformers, and the like. Basically, according to a preferred embodiment, the merging unit 100 may provide the following LNs: TCTR, TVTR, MMXU, MMXU including PMU (phasor measurement) data, QFVR, QITR, QIUB, QVTR, QVUB, QVIR, GGIO.

Further optional LNs are application depending: XCBR, XSWI, RDRE, CSWI, RSYN, . . . and may also be implemented by the inventive merging unit 100. Their use, however, is subject to setting of additional application functional blocks (AFBs).

According to a particularly preferred embodiment, the information originating from and/or to be supplied to the LNs are mapped to one of the following protocols according to the type of information: Status information, commands, settings and derived measurements are mapped to MMS reports based on IEC 61850-8-1, cf. the protocol block 180. In addition, derived measurements and binary information could e.g. be mapped to IEC 61850-8-1 GOOSE (Generic Object Oriented Substation Event) depending on the application, also cf. the protocol block 180. Sampled measured values (SMV) are mapped to IEC 61850-9-2 SMV by means of the further protocol block 182. Power quality information and/or phasor measurement information may be mapped to one of the aforedescribed protocols by means of the protocol blocks 180, 182. According to a preferred embodiment, phasor measurement data may be mapped to IEC 61850-90-5 and/or IEEE C37.118 by a respective protocol block (see reference numeral 184 in FIG. 4).

The specific mapping of the communications supported by the protocol blocks 180, 182 to physical interfaces is subject of setting. According to an embodiment, the IEC 61850-8-1 protocol block 180 is mapped to a dedicated Ethernet port ETH1. This port ETH1 may also be shared together with the IEC 61850-9-2 protocol block 182 and/or with 61850-90-5 and/or IEEE C37.118. Further, the IEC 61850-9-2 protocol block 182 may be mapped to a dedicated further Ethernet port ETH2, in particular separately or commonly together with IEC 61850-90-5 and/or IEEE C37.118. The physical implementation of the interfaces ETH1 and ETH2 and the related network topology is not subject of the present invention. The implementation could e.g. be wired (CAT5 or the like) or fibre optic, single or redundant port, in accordance with IEC 61850-90-4 or could comprise further communications channels capable of supporting the disclosed protocols. The same applies to the data rate of the interfaces ETH1, ETH2.

According to a preferred embodiment, one or more of the communications- and protocol-related blocks of the merging unit 100 explained above with reference to FIG. 3 may advantageously be implemented by the control unit 120 (FIG. 1) or its digital signal processing means.

Figure 4:
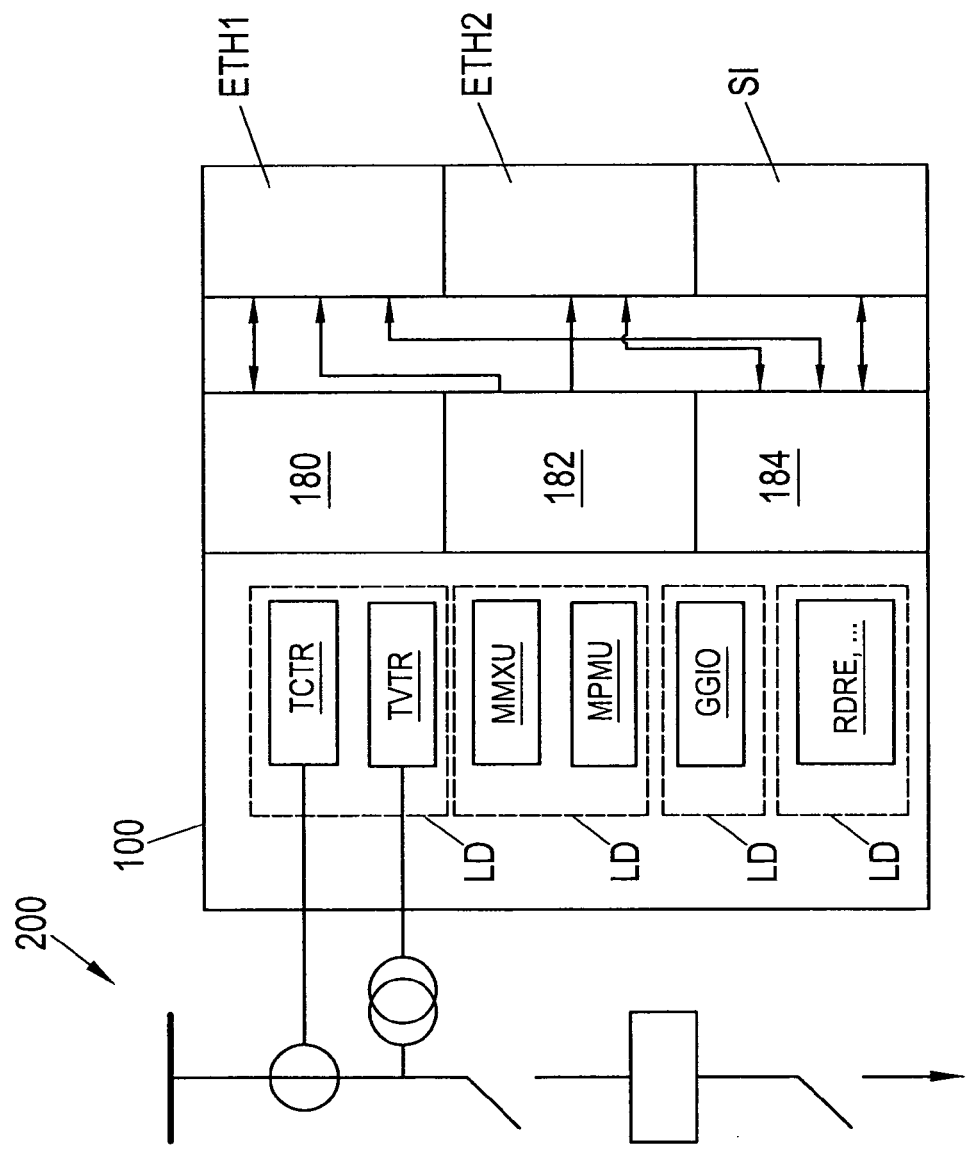
FIG. 4 depicts a schematic block diagram of a fourth embodiment of the inventive merging unit.

FIG. 4 depicts an internal structure of an inventive merging unit 100 according to a further embodiment from the communication point of view based on IEC 61850. The merging unit 100 depicted in FIG. 4 corresponds to the merging unit described above with respect to FIG. 3 with the following additional characteristics. The merging unit 100 shown in FIG. 4 provides the logical nodes (LNs) TCTR, TVTR, MMXU, MMXU including PMU (phasor measurement) data, GGIO and RDRE, but may also provide further LNs such as QFVR, QITR, QIUB, QVTR, QVUB, QVIR, XCBR, XSWI, CSWI and RSYN.

The merging unit 100 provides a protocol block 184 which may map phasor measurement data to IEC 61850-90-5 and/or to IEEE C37.118. Communications according to IEC 61850-90-5 and/or IEEE C37.118, as supported in particular by the protocol block 184, may be mapped to one of Ethernet ports ETH1 or ETH2 or also to a serial communication link SI.

Figure 5:
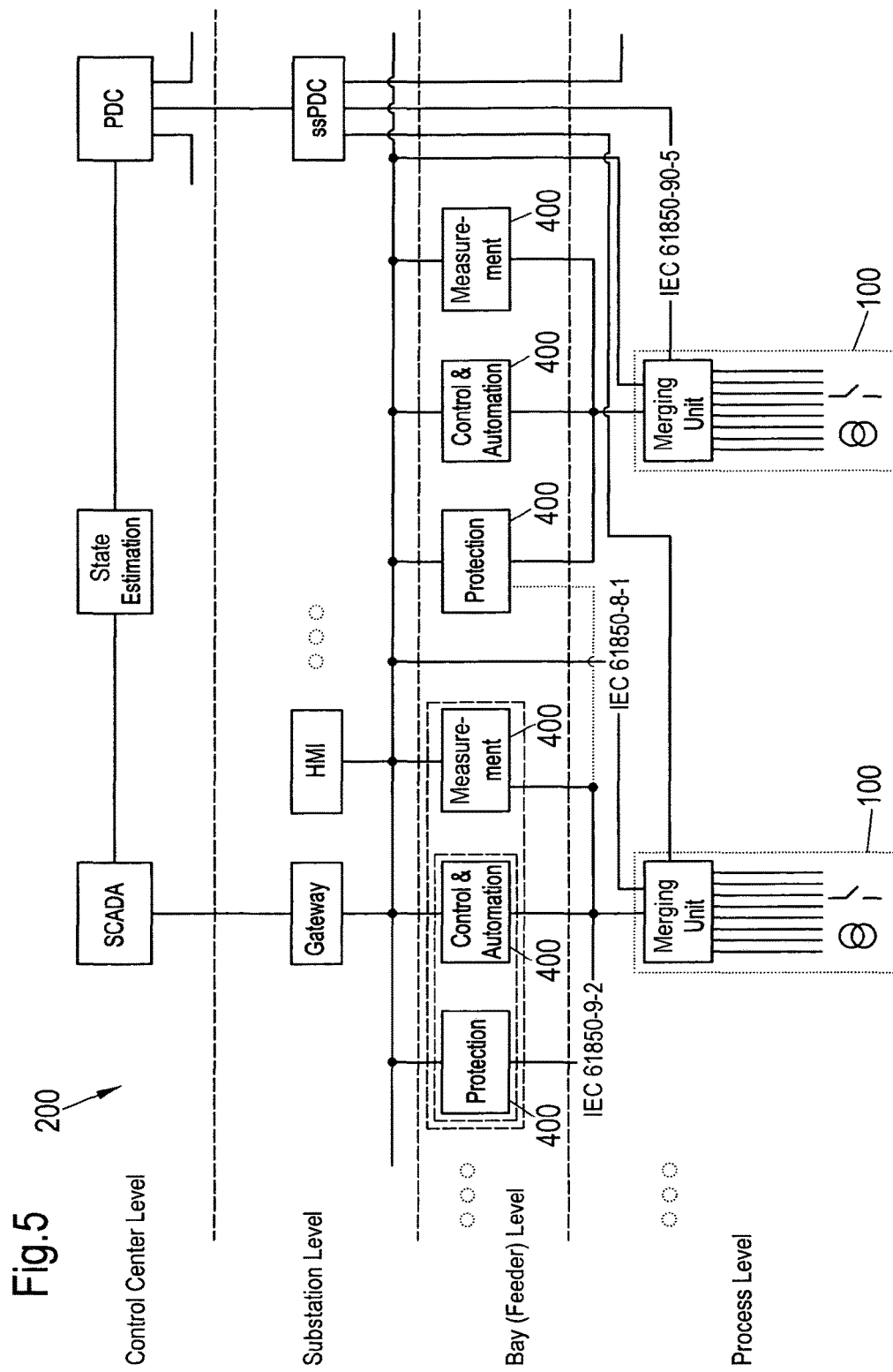
FIG. 5 depicts a schematic diagram of a power system comprising an inventive merging unit and a communication scenario in the power system.

FIG. 5 depicts a schematic diagram of a power system 200 comprising inventive merging units 100 and a communication scenario in the power system. The dashed lines in FIG. 5 delineate the process level, bay level, substation level and control center level of the power system 200, wherein the merging units 100 represent devices on the process level.

As shown by the solid lines in FIG. 5 which connect to the merging units 100, the inventive merging units 100 are configured to communicate data, in particular sampled measured values (SMV) data, to various bay level IEDs 400, in particular including at least one protection IED 400, at least one control and automation IED 400 and at least one measurement IED 400, by mapping the respective data to the IEC 61850-9-2 sampled measured values, SMV, communication protocol. Furthermore, the merging units 100 are configured to communicate power quality information PQ to devices on the substation level, in particular to a Gateway device and to a human machine interface device, HMI, by mapping the respective information to the IEC 61850-8-1, Mapping to MMS, communication protocol and/or to the IEC 61850-8-1 Generic Object Oriented Substation Event, GOOSE, communication protocol. Furthermore, the merging units 100 are configure to communicate phasor measurement information PHM to a substation level phasor data concentrator, ssPDC, by mapping the phasor measurement information PHM to the IEC 61850-90-5 (Synchrophasor) communication protocol.

Eventually, the information provided by the merging units 100 may be provided to devices on the control center level, such as a supervisory control and data acquisition system, SCADA, or a control center level phasor data concentrator, PDC, and can be used for state estimation by a control center level state estimation unit as shown in FIG. 5.

The merging unit 100 according to the embodiments is going far beyond the conventional systems and implementations of power quality assessment and/or phasor measurement assessment in dedicated IEDs or as a function in protection relays. Due to the emerging use of merging units 100, the invention is advantageously incorporating PQ and/or PHM data generation and/or analysis into the merging unit 100 and communicating conventional SMV as well as power quality data PQ and/or phasor measurement data PHM via the same or different communications ports ETH1, ETH2, SI to the upper level of a substation automation system comprising said merging unit 100. This advantageously ensures that the measurement of input data ID and the determination of power quality information PQ and/or of phasor measurement information PHM can be done with the highest possible accuracy and less additional HW such as conventional dedicated IEDs for assessing power quality. The merging unit 100 according to the embodiments can advantageously use existing communications infrastructure and is open for future standardisation on communication protocol level.

According to a further preferred embodiment, the merging unit 100 according to the embodiments may be remote configured, e.g. via a HTTP interface or the like provided by the control unit 120 (FIG. 1) or a dedicated integrated web server module.

The invention claimed is:

1. An apparatus for substation automation of a power system, the apparatus comprising:
   circuitry configured to:
   receive input data characterizing at least one voltage and/or current related to a component of a power system,
   interface to an external synchronization network,
   implement logical nodes,
   map information to and/or from at least one of the logical nodes to first communication protocol,
   determine power quality information depending on the input data,
   associate the power quality information with timing information supplied by the circuitry, wherein
   the logical nodes comprise at least one of frequency variation, current transient, current unbalance variation, voltage transient, and voltage unbalance variation, map information to and/or from at least one of the logical nodes to a second communication protocol, and forward the determined power quality information with associated timing information to a plurality of electronic devices external to the circuitry via a plurality of physical ports dedicated to specific communication protocols for monitoring, protecting, and controlling a power quality of an electrical power grid of the power system.

2. The apparatus according to claim 1, wherein the circuitry is further configured to transform the received input data into a predetermined output format, whereby transformed input data is obtained, and to output the transformed input data to a further device.

3. The apparatus according to claim 1, wherein the circuitry is further configured to output the power quality information to a further device.

4. The apparatus according to claim 1, wherein the circuitry is further configured to assign timestamp information to the power quality information and/or the input data and/or the transformed input data.

5. The apparatus according to claim 1, wherein the circuitry is further configured to map communications according to a first protocol to a first physical communications port, and to map communications according to a second protocol to a second physical communications port.

6. An apparatus for substation automation of a power system, the apparatus comprising:
   circuitry configured to:
   receive input data characterizing at least one voltage and/or current related to a component of a power system,
   interface to an external synchronization network,
   implement logical nodes,
   map information to and/or from at least one of the logical nodes to a first communication protocol,
   determine phasor measurement information depending on the input data,
   associate the phasor measurement information with timing information supplied by the circuitry, wherein
   the logical nodes comprise at least one of measurement circuit including phasor measurement and generic processor input/output,
   map information to and/or from at least one of the logical nodes to a second communication protocol, and
   forward the determined phasor measurement information with associated timing information to a plurality of electronic devices external to the circuitry via a plurality of physical ports dedicated to specific communication protocols for monitoring, protecting, and controlling a power quality of an electrical power grid of the power system.

7. A method implemented by circuitry for substation automation of a power system, the method comprising:
   receiving input data characterizing at least one voltage and/or current related to a component of a power system;
   interfacing to an external synchronization network;
   implementing logical nodes;
   mapping information to and/or from at least one of the logical nodes to a first communication protocol,
   determining power quality information depending on the input data,
   associating the power quality information with timing information supplied by the circuitry, wherein the logical nodes comprise at least one of frequency variation, current transient, current unbalance variation, voltage transient, and voltage imbalance variation;
   mapping information to and/or from at least one of the logical nodes to a second communication protocol; and
   forwarding the determined power quality information with associated timing information to a plurality of electronic devices external to the circuitry via a plurality of physical ports dedicated to specific communication protocols for monitoring, protecting, and controlling a power quality of an electrical power grid of the power system.

8. The method according to claim 7, the method further comprising:
   transforming the received input data into a predetermined output format, whereby transformed input data is obtained; and
   outputting the transformed input data to a further device.

9. The method according to claim 7, the method further comprising:
   outputting the power quality information to a further device.

10. The method according to claim 7, the method further comprising:
    assigning timestamp information to the power quality information and/or the input data and/or the transformed input data.

11. The method according to claim 7, the method further comprising:
    mapping communications according to a first protocol to a first physical communications port; and
    mapping communications according to a second protocol to a second physical communications port.

* * * * *